(12) United States Patent  
Wu et al.

(10) Patent No.: US 9,391,045 B2  
(45) Date of Patent: Jul. 12, 2016

(54) RECESSED SEMICONDUCTOR SUBSTRATES AND ASSOCIATED TECHNIQUES

(71) Applicant: Marvell World Trade Ltd., St. Michael (BB)

(72) Inventors: Albert Wu, Palo Alto, CA (US); Roawen Chen, San Jose, CA (US); Chung Chyung (Justin) Han, San Jose, CA (US); Shiann-Ming Liou, Campbell, CA (US); Chien-Chuan Wei, San Diego, CA (US); Runzi Chang, San Jose, CA (US); Scott Wu, San Jose, CA (US); Chuan-Cheng Cheng, Fremont, CA (US)

(73) Assignee: Marvell World Trade Ltd., St. Michael (BB)

( * ) Notice: Subject to any disclaimer, the term of this patent is extended or adjusted under 35 U.S.C. 154(b) by 0 days.

(21) Appl. No.: 14/715,170

(22) Filed: May 18, 2015

(65) Prior Publication Data

US 2015/0279806 A1    Oct. 1, 2015

Related U.S. Application Data

(62) Division of application No. 13/015,988, filed on Jan. 28, 2011, now Pat. No. 9,034,730.

(60) Provisional application No. 61/325,189, filed on Apr. 16, 2010, provisional application No. 61/321,068, filed on Apr. 5, 2010, provisional application No. 61/316,282, filed on Mar. 22, 2010, provisional application No. 61/301,125, filed on Feb. 3, 2010.

(51) Int. Cl.
*H01L 21/00*    (2006.01)
*H01L 25/04*    (2014.01)

(Continued)

(52) U.S. Cl.
CPC .............. *H01L 25/04* (2013.01); *H01L 21/486* (2013.01); *H01L 23/13* (2013.01); *H01L 23/147* (2013.01);

(Continued)

(58) Field of Classification Search
CPC ................................ H01L 23/48; H01L 21/56
See application file for complete search history.

(56) References Cited

U.S. PATENT DOCUMENTS 5,557,066 A    9/1996    Rostoker et al.
6,127,460 A    10/2000    Kazuto (Continued)

FOREIGN PATENT DOCUMENTS

CN    101252118 A    8/2008
WO    WO2009070348 A1    6/2009

*Primary Examiner* — Whitney T Moore
*Assistant Examiner* — Joseph Galvin, III

(57) ABSTRACT

Embodiments of the present disclosure provide a method, comprising providing a semiconductor substrate having (i) a first surface and (ii) a second surface that is disposed opposite to the first surface, forming one or more vias in the first surface of the semiconductor substrate, the one or more vias initially passing through only a portion of the semiconductor substrate without reaching the second surface, forming a dielectric film on the first surface of the semiconductor substrate, forming a redistribution layer on the dielectric film, the redistribution layer being electrically coupled to the one or more vias, coupling one or more dies to the redistribution layer, forming a molding compound to encapsulate at least a portion of the one or more dies, and recessing the second surface of the semiconductor substrate to expose the one or more vias. Other embodiments may be described and/or claimed.

20 Claims, 11 Drawing Sheets

(51) Int. Cl.
  *H01L 21/48*  (2006.01)
  *H01L 23/13*  (2006.01)
  *H01L 23/14*  (2006.01)
  *H01L 23/498* (2006.01)
  *H01L 25/065* (2006.01)
  *H01L 25/10*  (2006.01)
  *H01L 25/00*  (2006.01)
  *H01L 23/367* (2006.01)
  *H01L 23/00*  (2006.01)

(52) U.S. Cl.
  CPC .......... *H01L 23/49827* (2013.01); *H01L 24/09* (2013.01); *H01L 24/17* (2013.01); *H01L 24/33* (2013.01); *H01L 25/0652* (2013.01); *H01L 25/0657* (2013.01); *H01L 25/105* (2013.01); *H01L 25/50* (2013.01); *H01L 23/3677* (2013.01); *H01L 24/16* (2013.01); *H01L 24/48* (2013.01); *H01L 24/73* (2013.01); *H01L 2224/02372* (2013.01); *H01L 2224/0401* (2013.01); *H01L 2224/13024* (2013.01); *H01L 2224/14181* (2013.01); *H01L 2224/16225* (2013.01); *H01L 2224/16235* (2013.01); *H01L 2224/32225* (2013.01); *H01L 2224/48227* (2013.01); *H01L 2224/73265* (2013.01); *H01L 2224/83904* (2013.01); *H01L 2225/06517* (2013.01); *H01L 2225/06527* (2013.01); *H01L 2225/06541* (2013.01); *H01L 2225/1023* (2013.01); *H01L 2225/1058* (2013.01); *H01L 2924/01078* (2013.01); *H01L 2924/01079* (2013.01); *H01L 2924/12042* (2013.01); *H01L 2924/12044* (2013.01); *H01L 2924/14* (2013.01); *H01L 2924/1515* (2013.01); *H01L 2924/1532* (2013.01); *H01L 2924/15153* (2013.01); *H01L 2924/15159* (2013.01); *H01L 2924/15311* (2013.01); *H01L 2924/15331* (2013.01); *H01L 2924/181* (2013.01); *H01L 2924/19042* (2013.01); *H01L 2924/19043* (2013.01)

(56) References Cited

U.S. PATENT DOCUMENTS

| | | |
|---|---|---|
| 2004/0084771 A1 | 5/2004 | Bolken et al. |
| 2006/0063312 A1 | 3/2006 | Kurita |
| 2006/0148250 A1 | 7/2006 | Kirby |
| 2009/0170241 A1 | 7/2009 | Shim et al. |
| 2009/0176348 A1* | 7/2009 | Griffiths .............. H01L 21/6835 438/458 |
| 2009/0212420 A1 | 8/2009 | Hedler et al. |
| 2009/0283899 A1 | 11/2009 | Yoon et al. |
| 2010/0244208 A1* | 9/2010 | Pagaila ................. H01L 21/568 257/659 |
| 2010/0308474 A1* | 12/2010 | Shibuya ................ H01L 21/486 257/778 |
| 2012/0061855 A1* | 3/2012 | Do .......................... H01L 25/50 257/778 |

* cited by examiner

RECESSED SEMICONDUCTOR SUBSTRATES AND ASSOCIATED TECHNIQUES

CROSS REFERENCE TO RELATED APPLICATIONS

This disclosure is a divisional of and claims priority to U.S. patent application Ser. No. 13/015,988, filed Jan. 28, 2011, now U.S. Pat. No. 9,034,730, issued May 19, 2015, which claims priority to U.S. Provisional Patent Application No. 61/325,189, filed Apr. 16, 2010, to U.S. Provisional Patent Application No. 61/321,068, filed Apr. 5, 2010, to U.S. Provisional Patent Application No. 61/316,282, filed Mar. 22, 2010, and to U.S. Provisional Patent Application No. 61/301,125, filed Feb. 3, 2010, which are incorporated herein by reference in their entirety.

TECHNICAL FIELD

Embodiments of the present disclosure relate to the field of integrated circuits, and more particularly, to techniques, structures, and configurations of recessed semiconductor substrates for package assemblies.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Integrated circuit devices, such as transistors, are formed on dies or chips that continue to scale in size to smaller dimensions. The shrinking dimensions of dies are challenging conventional substrate fabrication and/or package assembly technologies that are currently used to route electrical signals to or from a semiconductor die. For example, laminate substrate technologies may not produce sufficiently small features on a substrate to correspond with the finer pitches of interconnects or other signal-routing features formed on the dies.

SUMMARY

In one embodiment, the present disclosure provides a method, comprising providing a semiconductor substrate having (i) a first surface and (ii) a second surface that is disposed opposite to the first surface, forming one or more vias in the first surface of the semiconductor substrate, the one or more vias initially passing through only a portion of the semiconductor substrate without reaching the second surface, forming a dielectric film on the first surface of the semiconductor substrate, forming a redistribution layer on the dielectric film, the redistribution layer being electrically coupled to the one or more vias, coupling one or more dies to the redistribution layer, forming a molding compound to encapsulate at least a portion of the one or more dies, and recessing the second surface of the semiconductor substrate to expose the one or more vias.

In another embodiment, the present disclosure provides a method comprising providing a semiconductor substrate having (i) a first surface and (ii) a second surface that is disposed opposite to the first surface, forming a dielectric film on the first surface of the semiconductor substrate, forming a redistribution layer on the dielectric film, coupling one or more dies to the redistribution layer, forming a molding compound to encapsulate at least a portion of the one or more dies, recessing the second surface of the semiconductor substrate, and forming one or more vias in the second surface of the semiconductor substrate, the one or more vias (i) passing through the semiconductor substrate to the first surface of the semiconductor substrate and (ii) being electrically coupled to the redistribution layer.

In another embodiment, the present disclosure provides an apparatus comprising a semiconductor substrate having a first surface, a second surface that is disposed opposite to the first surface, a dielectric film formed on the first surface, a redistribution layer formed on the dielectric film, and one or more vias formed in the semiconductor substrate to provide an electrical pathway between the redistribution layer and the second surface of the semiconductor substrate, a die coupled to the redistribution layer, and a molding compound formed on the first surface of the semiconductor substrate.

BRIEF DESCRIPTION OF THE DRAWINGS

Embodiments of the present disclosure will be readily understood by the following detailed description in conjunction with the accompanying drawings. To facilitate this description, like reference numerals designate like structural elements. Embodiments herein are illustrated by way of example and not by way of limitation in the figures of the accompanying drawings.

DETAILED DESCRIPTION

Embodiments of the present disclosure describe techniques, structures, and configurations for a semiconductor substrate having a recessed region and associated package assemblies.

The description may use perspective-based descriptions such as up/down, over/under, and/or top/bottom. Such descriptions are merely used to facilitate the discussion and are not intended to restrict the application of embodiments described herein to any particular orientation.

For the purposes of the present disclosure, the phrase "A/B" means A or B. For the purposes of the present disclosure, the phrase "A and/or B" means "(A), (B), or (A and B)." For the purposes of the present disclosure, the phrase "at least one of A, B, and C" means "(A), (B), (C), (A and B), (A and C), (B and C), or (A, B and C)." For the purposes of the present disclosure, the phrase "(A)B" means "(B) or (AB)" that is, A is an optional element.

Various operations are described as multiple discrete operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

The description uses the phrases "in an embodiment," "in embodiments," or similar language, which may each refer to one or more of the same or different embodiments. Furthermore, the terms "comprising," "including," "having," and the like, as used with respect to embodiments of the present disclosure, are synonymous.

Figure 1:
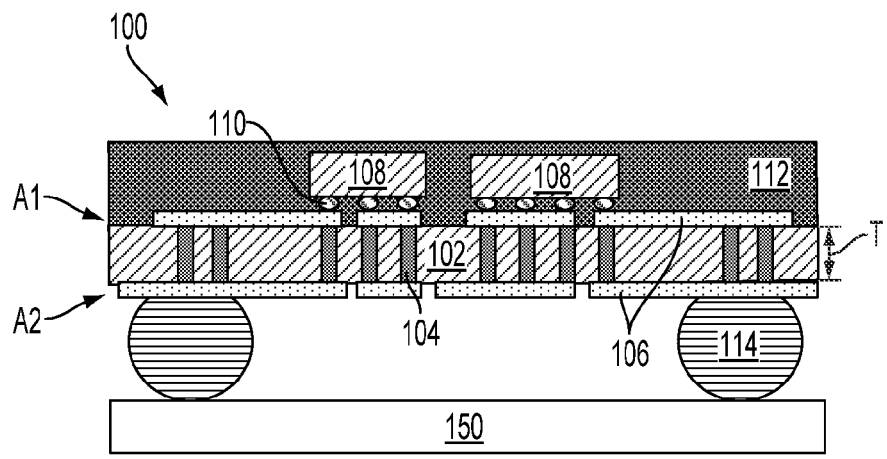
FIGS. 1-6B schematically illustrate configurations for various example package assemblies that include a semiconductor substrate having a recessed surface.

FIGS. 1-6B schematically illustrate configurations for various example package assemblies that include a semiconductor substrate 102 having a recessed surface. FIG. 1 depicts a configuration for a package assembly 100, in accordance with various embodiments. The package assembly 100 includes a semiconductor substrate 102, which is a substrate or interposer that substantially comprises a semiconductor material such as, for example, silicon (Si). That is, the bulk of the material of the semiconductor substrate 102 is a semiconductor material. The semiconductor material can include crystalline and/or amorphous types of material. In the case of silicon, for example, the silicon can include single crystal and/or polysilicon types. In other embodiments, the semiconductor substrate 102 can include other semiconductor materials such as, for example, germanium, group III-V materials, or group II-VI materials, that may also benefit from the principles described herein.

The semiconductor substrate 102 includes a first surface, A1, and a second surface, A2, that is disposed opposite to the first surface A1. The first surface A1 and the second surface A2 generally refer to opposing surfaces of the semiconductor substrate 102 to facilitate the description of various configurations described herein.

According to various embodiments, the second surface A2 of the semiconductor substrate is recessed. The recessed second surface A2 generally provides a relatively thinner area of the semiconductor substrate 102 to facilitate the formation of one or more vias 104 through the semiconductor substrate 102. In some embodiments, the semiconductor substrate 102 is recessed to have a thickness, T, between about 10 microns and about 500 microns.

Generally, the semiconductor substrate 102 is fabricated using technologies similar to those that are used to fabricate integrated circuit (IC) structures on a die or chip. For example, well-known patterning processes such as lithography/etch and/or deposition processes for fabricating IC devices on a die can be used to form features of the semiconductor substrate 102. By using semiconductor fabrication techniques, the semiconductor substrate 102 can include smaller features than other types of substrates such as laminate (e.g., organic) substrates. The semiconductor substrate 102 facilitates routing of electrical signals, such as input/output (I/O) and/or power/ground signals, for dies that continue to shrink in size. For example, in some embodiments, the semiconductor substrate 102 allows for fine pitch Si-to-Si interconnects and final line routing between the semiconductor substrate 102 and one or more dies 108.

According to various embodiments, one or more vias 104 are formed through the semiconductor substrate 102. The one or more vias 104 provide an electrical pathway between the first surface A1 and the second surface A2 of the semiconductor substrate 102. The one or more vias 104 generally comprise a material that is electrically and/or thermally conductive such as a metal. A dielectric material (e.g., dielectric film 105 of FIG. 7C) may be disposed between the metal of the one or more vias 104 and the semiconductor material of the semiconductor substrate 102. In an embodiment where the semiconductor substrate 102 comprises silicon, the one or more vias 104 are one or more through-silicon vias (TSVs).

A dielectric film (e.g., dielectric film 105 of FIG. 7L) is formed on the first surface A1 and/or the second surface A2 of the semiconductor substrate. The dielectric film can be configured in the package assembly 100 and the other package assemblies of FIGS. 2-6 similar to the dielectric film 105 depicted in connection with, e.g., FIGS. 7B-7M, FIGS. 8A-8G, or FIGS. 9A-9H. The dielectric film is not depicted in FIGS. 1-6 in order to avoid obscuring aspects of these figures. The dielectric film can include, for example, silicon dioxide ($SiO_2$), silicon nitride (SiN), silicon oxynitride ($SiO_xN_y$), or other suitable dielectric materials. The dielectric film generally provides electrical isolation for electrically conductive material disposed on the semiconductor substrate 102 to prevent current leakage between the electrically conductive material and the semiconductor material (e.g., silicon) of the semiconductor substrate 102.

One or more redistribution layers 106 are formed on the semiconductor substrate 102 to route the electrical signals of the one or more dies 108 that are coupled to the semiconductor substrate 102. For example, the one or more redistribution layers 106 can provide electrical routing between the one or more dies 108 and the one or more vias 104. The one or more redistribution layers 106 generally include an electrically conductive material such as, for example, a metal (e.g., copper or aluminum). Other suitable electrically conductive materials can be used to form the one or more redistribution layers 106 in other embodiments.

The one or more redistribution layers 106 can include a variety of structures to route the electrical signals such as, for example, pads, lands, or traces. Although not depicted, a passivation layer comprising an electrically insulative material such as polyimide, for example, can be deposited on the one or more redistribution layers 106 and patterned to provide openings in the passivation layer to allow electrical coupling of the one or more dies 108 to the one or more redistribution layers 106.

One or more dies 108 are coupled to the semiconductor substrate 102. The one or more dies 108 generally comprise a semiconductor material, such as, for example, silicon. In an embodiment, the one or more dies 108 and the semiconductor substrate 102 are fabricated using the same semiconductor material to reduce stress associated with heating/cooling mismatch of materials such as, for example, mismatched coefficients of thermal expansion (CTE).

The one or more dies 108 can be coupled to the semiconductor substrate 102 using any suitable configuration. The one or more dies 108 generally have an active side that includes a surface upon which a plurality of integrated circuit (IC) devices (not shown) such as transistors for logic and/or memory are formed and an inactive side that is disposed opposite to the active side. The active side of the one or more dies 108 is electrically coupled to the one or more redistribution layers 106.

In some embodiments, the active side of the one or more dies 108 is coupled to the one or more redistribution layers 106 using one or more bumps 110 in a flip-chip configuration, as can be seen. In other embodiments, the active side of the one or more dies 108 is electrically coupled to the one or more redistribution layers 106 using other structures, such as, for example, one or more bonding wires to provide a wire-bonding configuration.

The one or more bumps 110 generally comprise an electrically conductive material such as, for example, solder or other metal to route the electrical signals of the one or more dies 108. According to various embodiments, the one or more bumps 110 comprise lead, gold, tin, copper, or lead-free materials, or combinations thereof. The one or more bumps 110 can have a variety of shapes including spherical, cylindrical, rectangular, or other shapes and can be formed using a bumping process, such as, for example, a controlled collapse chip connect (C4) process, stud-bumping, or other suitable process.

Although not shown, one or more other active or passive components can be mounted on the semiconductor substrate 102. The components can include Electronic Compounds and integrated circuits (ICs). The components can include, for example, filter components, resistors, inductors, power amplifiers, capacitors, or packaged ICs. Other active or passive components can be coupled to the semiconductor substrate 102 in other embodiments.

A molding compound 112 is disposed on the first surface A1 of the semiconductor substrate 102. The molding compound 112 generally comprises an electrically insulative material, such as a thermosetting resin, that is disposed to protect the one or more dies 108 from moisture, oxidation, or chipping associated with handling. In some embodiments, the molding compound 112 is disposed to substantially encapsulate the one or more dies 108 and substantially fill a region between the one or more dies 108 and the semiconductor substrate 102 (e.g., between the one or more bumps 110), as can be seen. The molding compound 112 can be selected to have a coefficient of thermal expansion (CTE) that is substantially the same or similar to a CTE of the semiconductor substrate 102 and/or the one or more dies 108 to reduce stress associated with mismatched CTE materials.

One or more package interconnect structures 114 such as, for example, one or more solder balls or posts are formed on the one or more redistribution layers 106 to further route the electrical signals of the one or more dies 108. In the depicted embodiment, the one or more package interconnect structures 114 are coupled to the one or more redistribution layers 106 on the second surface A2 of the semiconductor substrate. The one or more package interconnect structures 114 generally comprise an electrically conductive material. The one or more package interconnect structures 114 can be formed in a variety of shapes including spherical, planar, or polygon shapes and can be positioned in a variety of positions including in a row or in an array of multiple rows. Although the one or more package interconnect structures 114 are depicted on a peripheral portion of the semiconductor substrate 102, the one or more package interconnect structures 114 can be disposed on or near a central portion of the semiconductor substrate 102 in other embodiments. In some embodiments, the one or more package interconnect structures 114 are configured in a ball-grid array (BGA) configuration.

The package assembly 100 can be electrically coupled to another electronic device 150 using the one or more package interconnect structures 114 to further route the electrical signals of the one or more dies 108 to the other electronic device 150. The other electronic device 150 can include, for example, as a printed circuit board (PCB) (e.g., motherboard), a module, or another package assembly.

Figure 2:
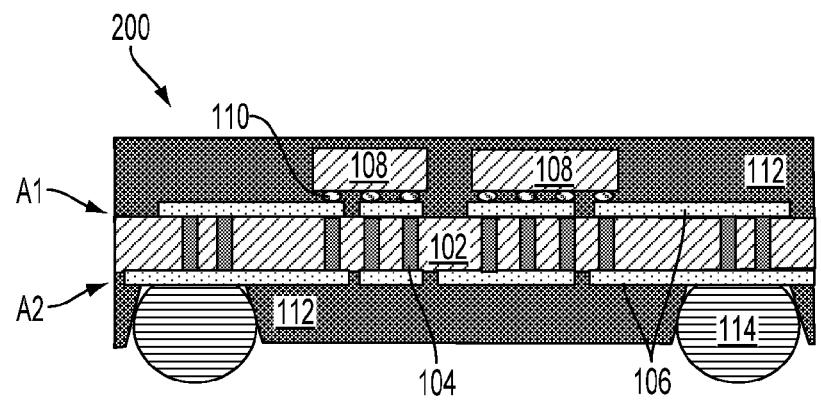

FIG. 2 depicts a configuration for a package assembly 200, in accordance with various embodiments. The package assembly 200 includes semiconductor substrate 102, one or more vias 104, one or more redistribution layers 106, one or more dies 108, one or more bumps 110, molding compound 112, and one or more package interconnect structures 114, which may comport with embodiments described in connection with the package assembly 100 of FIG. 1. In FIG. 2, the molding compound 112 is further formed on the second surface A2 of the semiconductor substrate 102. At least a portion of the one or more package interconnect structures 114 is exposed to route electrical signals of the one or more dies 108 to another electronic device (e.g., the other electronic device 150 of FIG. 1).

Figure 3:
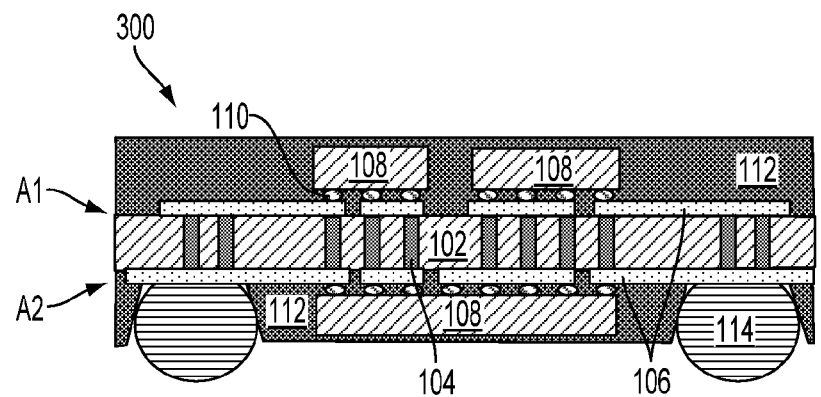

FIG. 3 depicts a configuration for a package assembly 300, in accordance with various embodiments. The package assembly 300 includes semiconductor substrate 102, one or more vias 104, one or more redistribution layers 106, one or more dies 108, one or more bumps 110, molding compound 112, and one or more package interconnect structures 114, which may comport with embodiments described in connection with the respective package assemblies 100 and 200 of FIGS. 1 and 2. In FIG. 3, at least one of the one or more dies 108 is coupled to the one or more redistribution layers 106 that are disposed on the second surface A2 of the semiconductor substrate 102. The one or more dies 108 can be disposed on both the first surface A1 and the second surface A2 of the semiconductor substrate 102.

Figure 4:
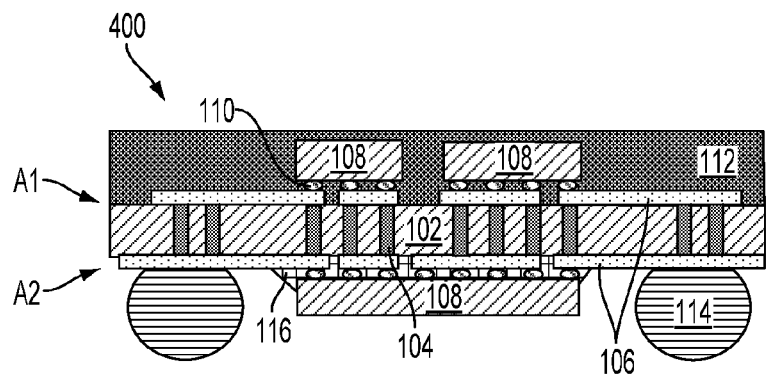

FIG. 4 depicts a configuration for a package assembly 400, in accordance with various embodiments. The package assembly 400 includes semiconductor substrate 102, one or more vias 104, one or more redistribution layers 106, one or more dies 108, one or more bumps 110, molding compound 112, and one or more package interconnect structures 114, which may comport with embodiments described in connection with the respective package assemblies 100, 200, and 300 of FIGS. 1, 2, and 3.

In FIG. 4, an underfill material 116 is disposed between at least one of the one or more dies 108 and the semiconductor substrate 102, as can be seen. The underfill material 116 can include, for example, an epoxy or other suitable electrically insulative material. The underfill material 116 generally increases adhesion between the one or more dies 108 and the semiconductor substrate 102, provides additional electrical insulation between the one or more bumps 110, and/or protects the one or more bumps 110 from moisture and oxidation.

In some embodiments (not shown), the underfill material 116 can be encapsulated with the molding compound 112. For example, the underfill material 116 may be disposed between the one or more dies 108 and the semiconductor substrate 102 to encapsulate the one or more bumps 110 and the molding compound 116 can be disposed to encapsulate the one or more dies 108 and the underfill material 116.

Figure 5:
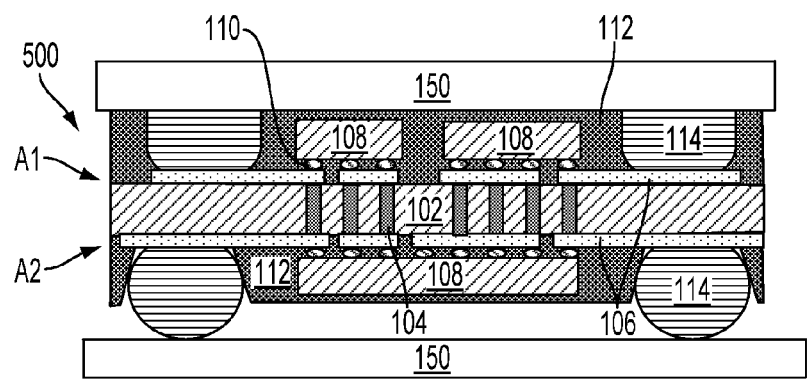

FIG. 5 depicts a configuration for a package assembly 500, in accordance with various embodiments. The package assembly 500 includes semiconductor substrate 102, one or more vias 104, one or more redistribution layers 106, one or more dies 108, one or more bumps 110, molding compound 112, and one or more package interconnect structures 114, which may comport with embodiments described in connection with the respective package assemblies 100, 200, 300, and 400 of FIGS. 1, 2, 3, and 4.

In FIG. 5, at least one of the one or more package interconnect structures 114 is coupled to the one or more redistribution layers 106 that are disposed on the first surface A1 of the semiconductor substrate 102. The one or more package interconnect structures 114 can be disposed on both the first surface A1 and the second surface A2 of the semiconductor substrate 102 to route the electrical signals of the one or more dies 108.

The package assembly 500 can be coupled to another electronic device 150 using the one or more package interconnect structures 114 on the first surface A1 and further coupled to another electronic device 150 using the one or more package interconnect structures 114 on the second surface A2, as can be seen. For example, the one or more package interconnect structures 114 on the second surface A2 can be used to route electrical signals of the one or more dies 108 to a printed circuit board (e.g., motherboard) upon which the package assembly 500 is mounted. The one or more package interconnect structures 114 on the first surface A1 can be used to route electrical signals of the one or more dies 108 to another package assembly stacked on the package assembly 500 to provide a package-on-package (PoP) configuration.

Figure 6A:
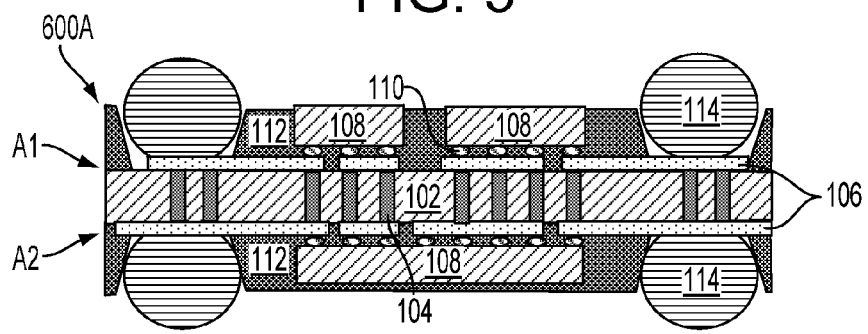

FIG. 6A depicts a configuration for a package assembly 600A, in accordance with various embodiments. The package assembly 600A includes semiconductor substrate 102, one or more vias 104, one or more redistribution layers 106, one or more dies 108, one or more bumps 110, molding compound 112, and one or more package interconnect structures 114, which may comport with embodiments described in connection with the respective package assemblies 100, 200, 300, 400, and 500 of FIGS. 1, 2, 3, 4, and 5.

In FIG. 6A, the molding compound 112 is formed to expose a surface of at least one of the one or more dies 108, as can be seen. The exposed surface(s) of the one or more dies 108 facilitates heat dissipation away from the one or more dies 108.

Figure 6B:
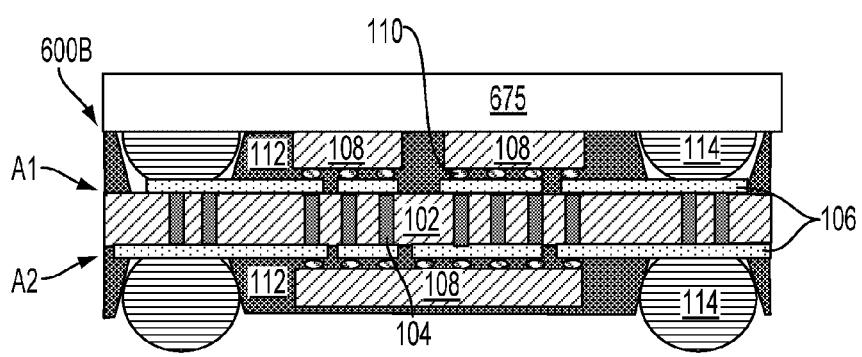

FIG. 6B depicts a configuration for a package assembly 600B, in accordance with various embodiments. The package assembly 600B is similar to the package assembly 600A of FIG. 6A, but further includes a heat dissipation structure 675 such as a heat sink. The heat dissipation structure 675 is thermally coupled to a backside of the one or more dies 108 as illustrated. In some embodiments, the one or more package interconnect structures 114 formed on the first surface A1 of the semiconductor substrate 102 facilitate heat conduction away from the package assembly 600B. In other embodiments, the one or more package interconnect structures 114 are not formed on the first surface A1 of the semiconductor substrate 102 at all and the molding compound 112 fills the area occupied by the one or more package interconnect structures 114 of FIG. 6B on the first surface A1.

Techniques and configurations described herein can provide benefits of reducing process complexity and/or cost associated with fabricating one or more vias 104 in a semiconductor substrate 102, enabling two-side utilizations of the semiconductor substrate 102, facilitating multi-stack package configurations, reducing a size of a package assembly, and/or increasing thermal dissipation. In some embodiments, the package assemblies 100, 200, 300, 400, 500, and 600 are final package assemblies, which are mounted or ready to be mounted on another electronic device such as, for example, a printed circuit board. Suitable combinations of embodiments described in connection with FIGS. 1-6 fall within the scope of the present disclosure.

FIGS. 7A-7M schematically illustrate a package assembly 700 subsequent to various process operations. The operations described in connection with FIGS. 7A-7M correspond with a method (e.g., method 1000 of FIG. 10) of fabricating a package assembly 700 where the one or more vias 104 are substantially formed prior to at least one of forming one or more redistribution layers 106, coupling one or more dies 108 to the semiconductor substrate 102, forming a molding compound 112, and recessing a surface of the semiconductor substrate 102, as described herein.

Figure 7A:
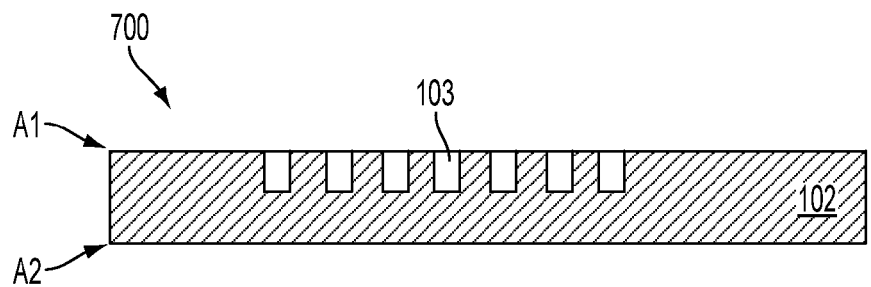
FIGS. 7A-7M schematically illustrate a package assembly subsequent to various process operations.

Referring to FIG. 7A, the package assembly 700 is depicted subsequent to one or more channels 103 being formed in the first surface A1 of the semiconductor substrate 102. The one or more channels 103 are areas where semiconductor material has been removed from the semiconductor substrate 102 as part of forming one or more vias (e.g., the one or more vias 104 of FIG. 7C) in the semiconductor substrate 102. The one or more channels 103 can be formed by selectively removing the semiconductor material using, for example, an etch process or a laser-drilling process. As can be seen, the one or more channels 103 pass through only a portion of the semiconductor substrate 102. That is, the one or more channels 103 formed in the first surface A1 do not reach the second surface A2 of the semiconductor substrate 102.

Figure 7B:
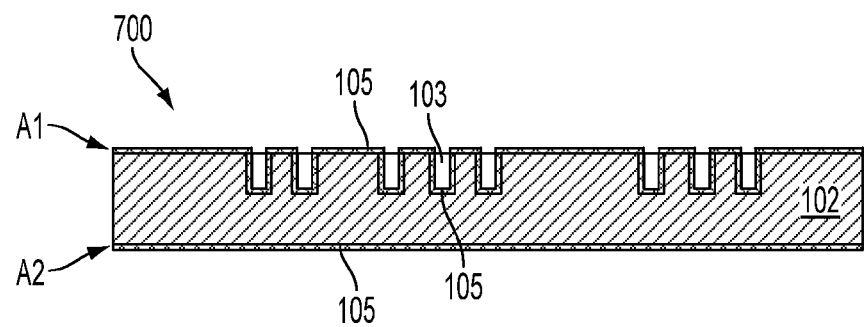

Referring to FIG. 7B, the package assembly 700 is depicted subsequent to a dielectric film 105 being formed on the first surface A1 and second surface A2 of the semiconductor substrate 102, including on surfaces (e.g., sidewalls) of the semiconductor substrate 102 in the one or more channels 103, as can be seen. The dielectric film 105 can be formed by using a deposition technique such as, for example, thermal growth, physical vapor deposition (PVD), chemical vapor deposition (CVD), and/or atomic layer deposition (ALD) to deposit a dielectric material such as, for example, silicon dioxide ($SiO_2$), silicon nitride (SiN), or silicon oxynitride ($SiO_xN_y$), where x and y represent suitable stoichiometric values. Other suitable deposition techniques and/or dielectric materials can be used in other embodiments.

Figure 7C:
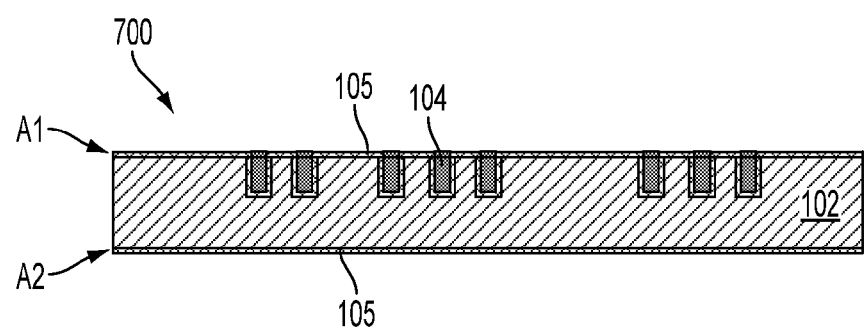

Referring to FIG. 7C, the package assembly 700 is depicted subsequent to an electrically conductive material being deposited into the one or more channels (e.g., the one or more channels 103 of FIG. 7B) to substantially form the one or more vias 104. The electrically conductive material can include, for example, a metal such as copper or other suitable material.

In one embodiment, the electrically conductive material is deposited to substantially fill the one or more channels. In another embodiment, the electrically conductive material is deposited to coat the dielectric film 105 on the surfaces of the one or more channels and an electrically insulative material such as, for example, an epoxy, resin, or oxide is deposited to fill a remaining portion of the one or more channels.

Figure 7D:
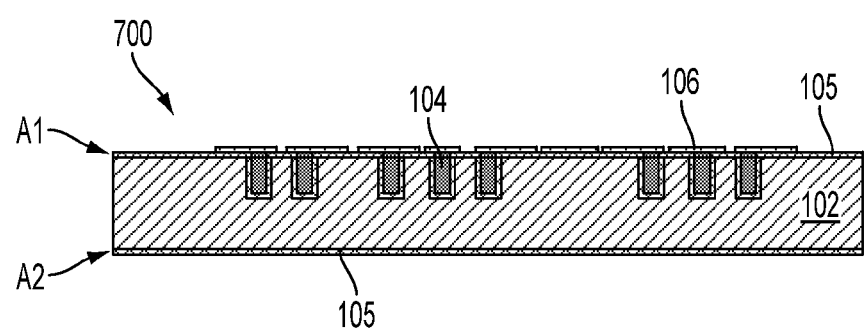

Referring to FIG. 7D, the package assembly 700 is depicted subsequent to one or more redistribution layers 106 being formed on the dielectric film 105 that is disposed on the first surface A1 of the semiconductor substrate 102. The one or more redistribution layers 106 are electrically coupled to the one or more vias 104. The one or more redistribution layers 106 can be formed by depositing an electrically conductive material using any suitable deposition technique. The deposited electrically conductive material can be patterned and/or etched to provide routing structures that route electrical signals of one or more dies. Multiple redistribution layers can be stacked to provide desired routing of the electrical signals.

Figure 7E:
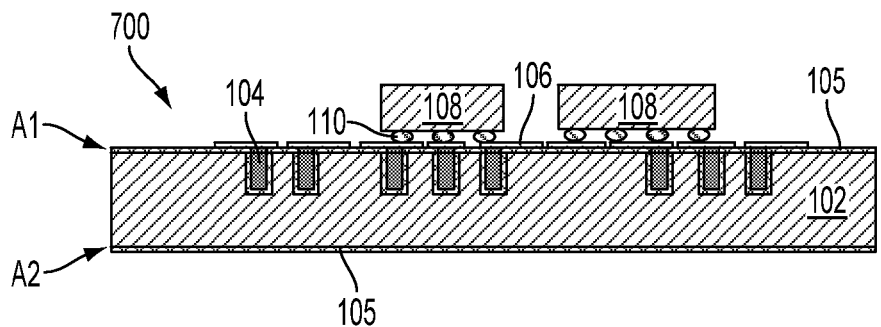

Referring to FIG. 7E, the package assembly 700 is depicted subsequent to one or more dies 108 being coupled to the one or more redistribution layers 106. The one or more dies 108 can be coupled to the semiconductor substrate 102 in a variety of configurations including, for example, flip-chip or wire-bonding configurations, or combinations thereof. In a flip-chip configuration, an active surface of the one or more dies 108 is coupled to the one or more redistribution layers 106 using one or more bumps 110, as can be seen. The one or more bumps 110 can include, for example, micro solder bumps or copper stud bumps. Other well-known die-to-wafer or die-to-die bonding techniques can be used in other embodiments. In a wire-bonding configuration (not shown), an inactive surface of the die is coupled to the semiconductor substrate using an adhesive and an active surface of the die is coupled to the one or more redistribution layers 106 using one or more bonding wires. The one or more dies 108 are electrically coupled to the one or more vias 104.

Figure 7F:
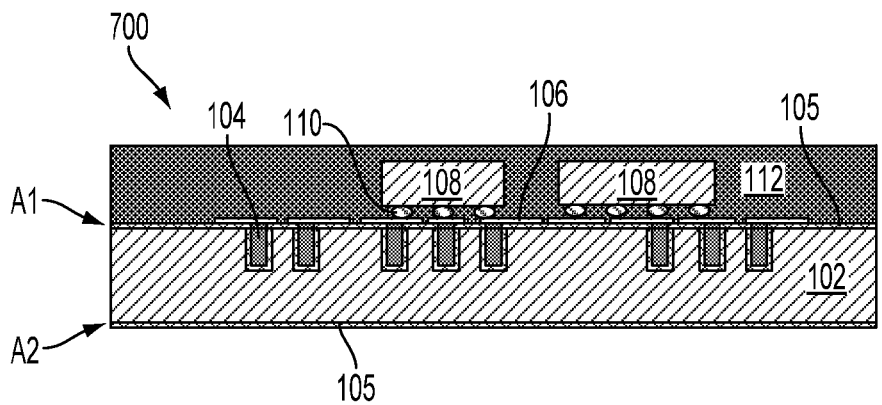

Referring to FIG. 7F, the package assembly 700 is depicted subsequent to a molding compound 112 being formed to encapsulate at least a portion of the one or more dies 108. According to various embodiments, the molding compound 112 is formed by depositing an electrically insulative material. For example, the molding compound 112 can formed by depositing a resin (e.g., a thermosetting resin) in solid form (e.g., a powder) into a mold and applying heat and/or pressure to fuse the resin. Other well-known techniques for forming the molding compound 112 can be used in other embodiments.

The molding compound 112 can be formed on the semiconductor substrate 102 when the semiconductor substrate 102 is in wafer form or singulated form. In the depicted embodiment, the molding compound 112 is formed to encapsulate the one or more dies 108.

The molding compound 112 can be formed to substantially fill a region between the one or more dies 108 and the semiconductor substrate 102 (e.g., between the one or more bumps 110), as can be seen, according to some embodiments. In other embodiments, an underfill material (e.g., underfill material 116 of FIG. 4) can be used in conjunction with the molding compound 112. That is, the underfill material can be disposed between the one or more dies 108 and the semiconductor substrate 102 and the molding compound 112 can be formed to encapsulate the underfill material.

Figure 7G:
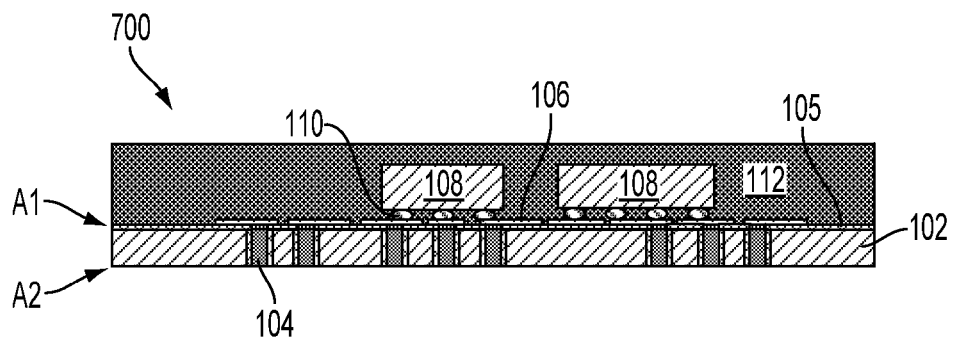

Referring to FIG. 7G, the package assembly 700 is depicted subsequent to the second surface A2 of the semiconductor substrate 102 being recessed to expose the one or more vias 104. The second surface A2 of the semiconductor substrate 102 can be recessed by a variety of suitable techniques including, for example, a grinding process or an etch process. In some embodiments, the semiconductor substrate 102 is recessed to have a thickness between about 10 microns and about 500 microns. Other recessing techniques and thicknesses can be used in other embodiments.

According to various embodiments, the molding compound 112 is used as a mechanical carrier to support the semiconductor substrate 102 during the recessing to expose the one or more vias 104. Additional operations can be performed on the recessed second surface A2 of the semiconductor substrate 102.

Figure 7H:
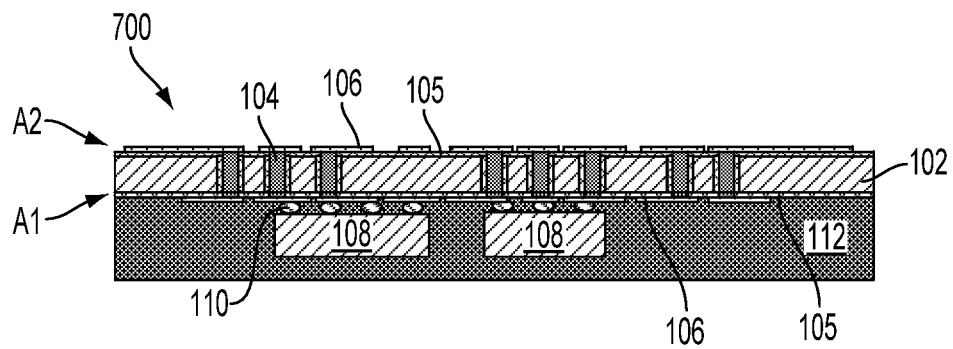

Referring to FIG. 7H, the package assembly 700 is depicted subsequent to a dielectric film 105 being formed on the recessed second surface A2 of the semiconductor substrate 102 and one or more redistribution layers 106 being formed on the dielectric film 105 on the second surface A2. The dielectric film 105 and the one or more redistribution layers 106 can be formed using techniques respectively described in connection with FIGS. 7B and 7D.

Figure 7I:
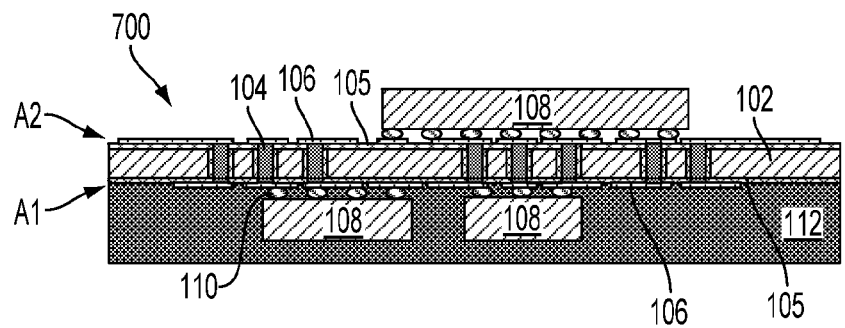

Referring to FIG. 7I, the package assembly 700 is depicted subsequent to additional one or more dies 108 being coupled to the one or more redistribution layers 106 on the second surface A2 of the semiconductor substrate 102. The additional one or more dies 108 can be coupled using techniques described in connection with FIG. 7E.

Figure 7J:
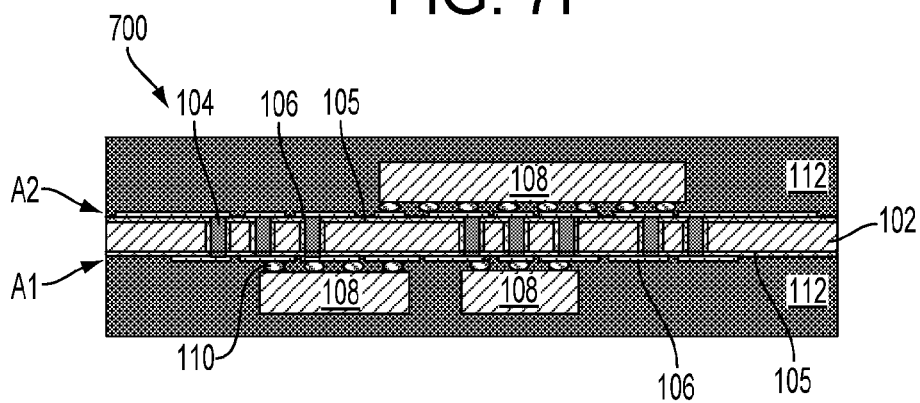

Referring to FIG. 7J, the package assembly 700 is depicted subsequent to forming a molding compound 112 on the second surface A2 of the semiconductor substrate 102. The molding compound 112 can be formed according to embodiments described in connection with FIG. 7F.

Figure 7K:
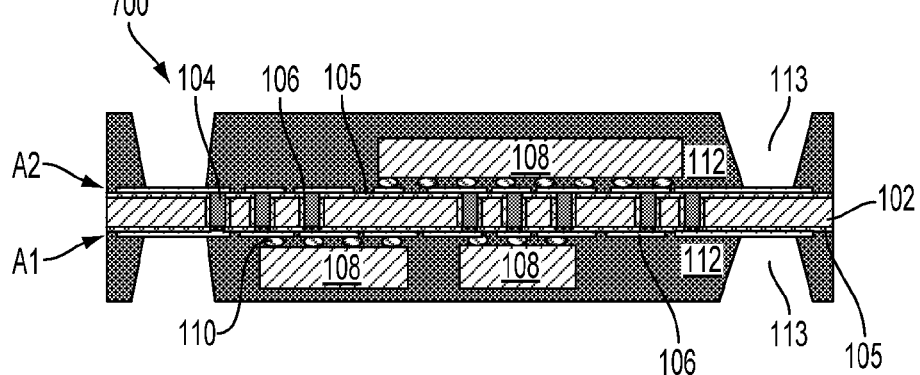

Referring to FIG. 7K, the package assembly 700 is depicted subsequent to forming one or more openings 113 in the molding compound 112 to expose the one or more redistribution layers 106 formed on the first surface A1 and/or the second surface A2 of the semiconductor substrate 102. The one or more openings 113 can be formed by using, for example, a laser process or an etch process. The one or more redistribution layers 106 can serve as a laser stop or etch stop material.

Figure 7L:
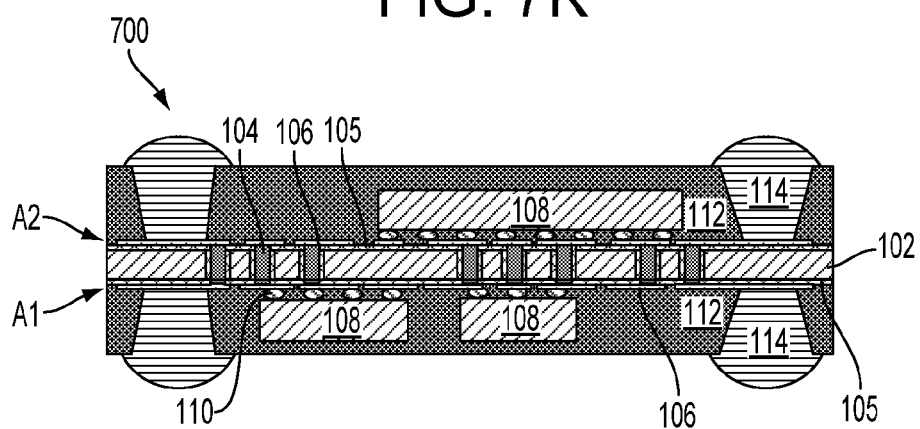

Referring to FIG. 7L, the package assembly 700 is depicted subsequent to coupling one or more package interconnect structures 114 to the one or more redistribution layers 106 through the one or more openings (e.g., the one or more openings 113 of FIG. 7K). The one or more package interconnect structures 114 can be formed by depositing an electrically conductive material into the one or more openings using a variety of suitable processes. For example, screen printing, electrical plating, placement, or other well-known processes can be used to deposit the electrically conductive material. The one or more package interconnect structures 114 can be formed on one or both of the first surface A1 and the second surface A2 of the semiconductor substrate 102 to route the electrical signals of the one or more dies 108 to or from the package assembly 700 to another electronic device (e.g., another electronic device 150 of FIG. 1).

Figure 7M:
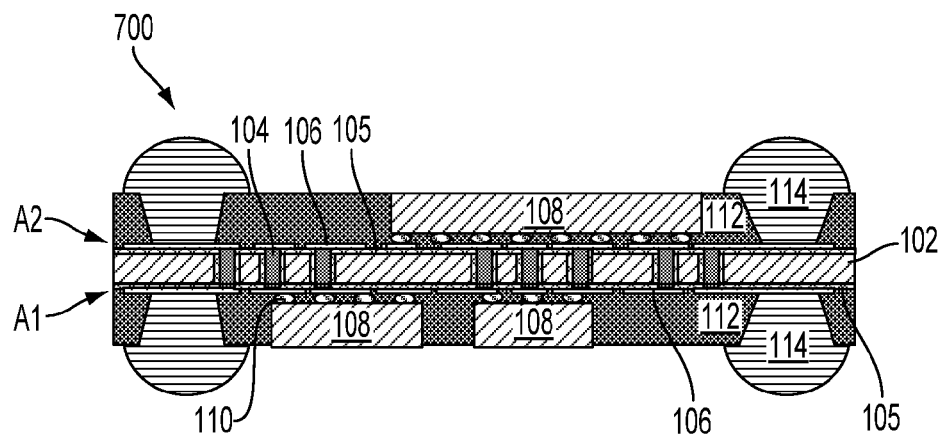

Referring to FIG. 7M, the package assembly 700 is depicted to show that, in some embodiments, the molding compound 112 is formed such that a surface of the one or more dies 108 is exposed to facilitate heat dissipation. That is, the molding compound 112 can be deposited, e.g., using a mold, such that the one or more dies 108 have an exposed surface. In other embodiments, the molding compound 112 is deposited to encapsulate the one or more dies 108 and is subsequently recessed, e.g., by chemical mechanical polishing (CMP), to expose the surface(s) of the one or more dies 108.

FIGS. 8A-8G schematically illustrate the package assembly 700 of FIG. 7E subsequent to other various process operations. The operations described in connection with FIGS. 8A-8G correspond with a technique where the one or more package interconnect structures 114 are coupled to the one or more redistribution layers 106 prior to the molding compound 112 being formed.

Figure 8A:
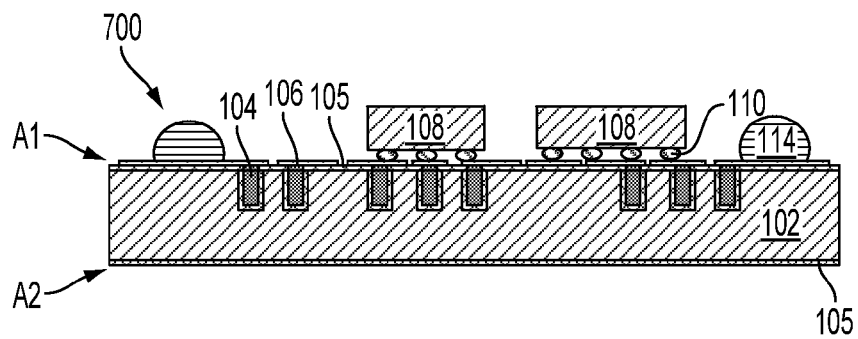
FIGS. 8A-8G schematically illustrate the package assembly of FIG. 7E subsequent to other various process operations.

Referring to FIG. 8A, the package assembly 700 of FIG. 7E is depicted subsequent to coupling one or more package interconnect structures 114 to the one or more redistribution layers 106. The one or more package interconnect structures 114 can be formed by depositing an electrically conductive material using a variety of suitable processes. For example, screen printing, electrical plating, placement, or other well-known processes can be used to deposit the electrically conductive material.

Figure 8B:
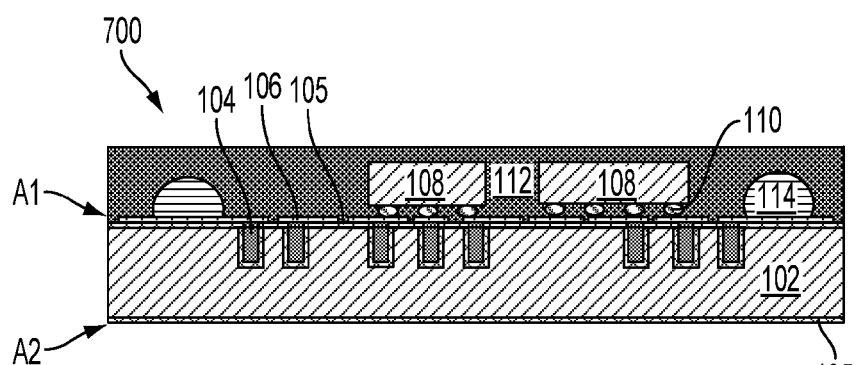

Referring to FIG. 8B, the package assembly 700 of FIG. 8A is depicted subsequent to forming a molding compound 112 on the semiconductor substrate 102. In some embodiments, the molding compound 112 is formed to substantially encapsulate the one or more package interconnect structures 114, as can be seen. The molding compound 112 can be formed according to embodiments described in connection with, e.g., FIGS. 7F and 7M.

Figure 8C:
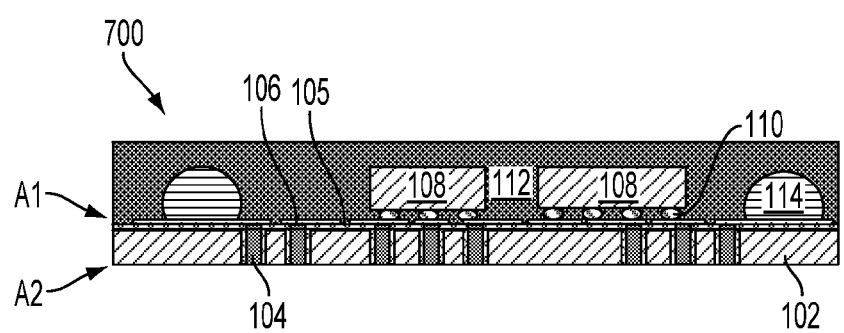

Referring to FIG. 8C, the package assembly 700 of FIG. 8B is depicted subsequent to recessing the second surface A2 of the semiconductor substrate 102 to expose the one or more vias 104. The semiconductor substrate 102 can be recessed according to embodiments described in connection with FIG. 7G.

Figure 8D:
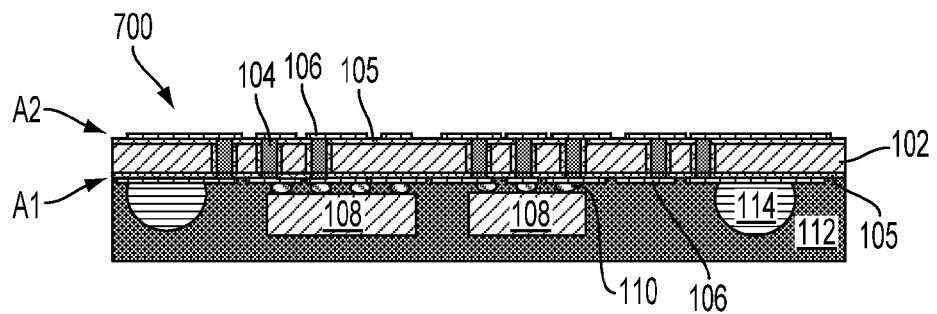

Referring to FIG. 8D, the package assembly 700 of FIG. 8C is depicted subsequent to a dielectric film 105 being formed on the recessed second surface A2 of the semiconductor substrate 102 and one or more redistribution layers 106 being formed on the dielectric film 105 on the second surface A2. The dielectric film 105 and the one or more redistribution layers 106 can be formed using techniques respectively described in connection with FIGS. 7B and 7D.

Figure 8E:
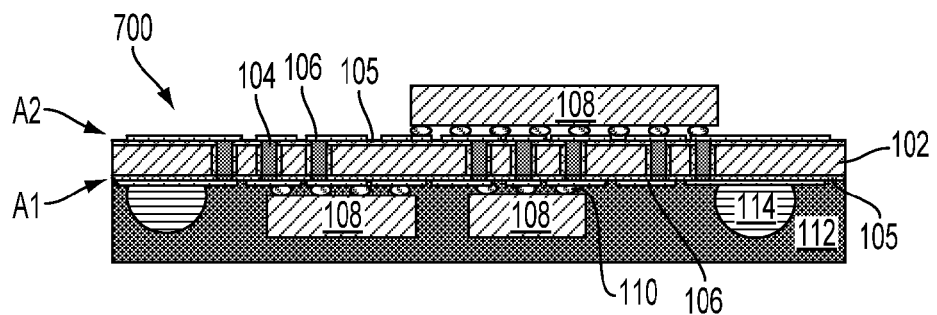

Referring to FIG. 8E, the package assembly 700 of FIG. 8D is depicted subsequent to additional one or more dies 108 being coupled to the one or more redistribution layers 106 on the second surface A2 of the semiconductor substrate 102. The additional one or more dies 108 can be coupled according to embodiments described in connection with FIG. 7E.

Figure 8F:
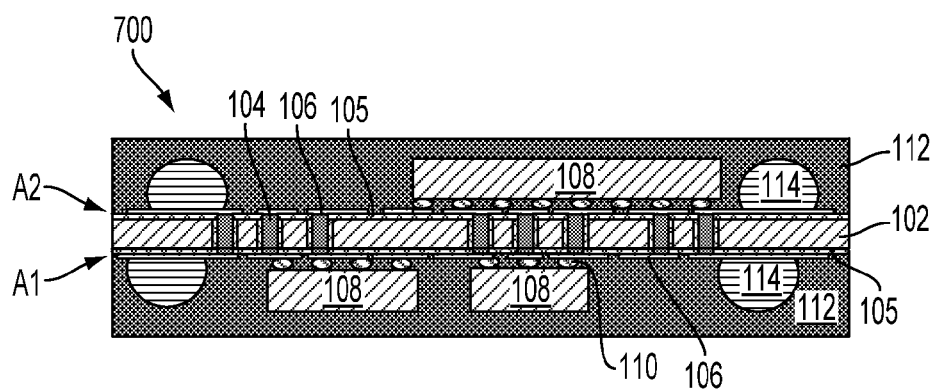

Referring to FIG. 8F, the package assembly 700 of FIG. 8E is depicted subsequent to forming additional one or more package interconnect structures 114 and forming a molding compound 112 on the second surface A2 of the semiconductor substrate 102. The molding compound 112 can be formed according to embodiments described in connection with FIG. 7F. The additional one or more package interconnect structures 114 can be formed according to embodiments described in connection with FIG. 8A.

Figure 8G:
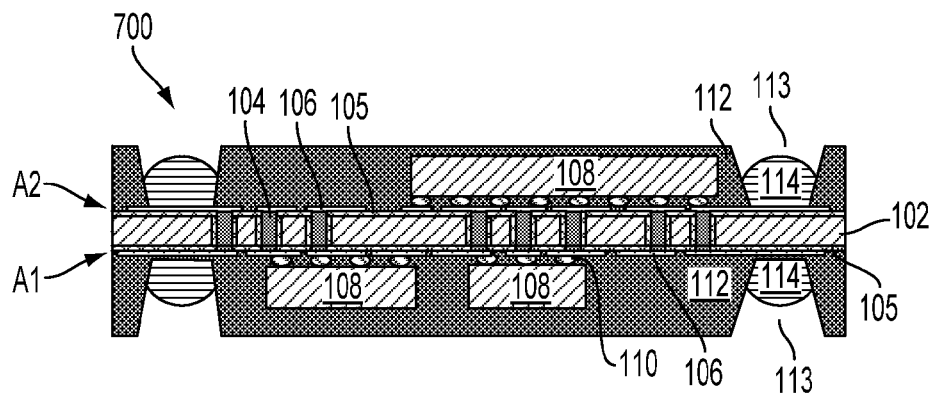

Referring to FIG. 8G, the package assembly 700 of FIG. 8F is depicted subsequent to forming one or more openings 113 in the molding compound to expose the one or more package interconnect structures 114. The one or more openings 113 can be formed by using, for example, a laser process or an etch process. The one or more package interconnect structures 114 can serve as a laser stop or etch stop material.

FIGS. 9A-9H schematically illustrate another package assembly 900 subsequent to various process operations. The operations described in connection with FIGS. 9A-7H correspond with a method (e.g., method 1100 of FIG. 11) of fabricating a package assembly 900 where the one or more vias 104 are substantially formed subsequent to at least one of forming one or more redistribution layers 106, coupling one or more dies 108 to the semiconductor substrate 102, forming a molding compound 112, and recessing a surface of the semiconductor substrate 102, as described herein.

Figure 9A:
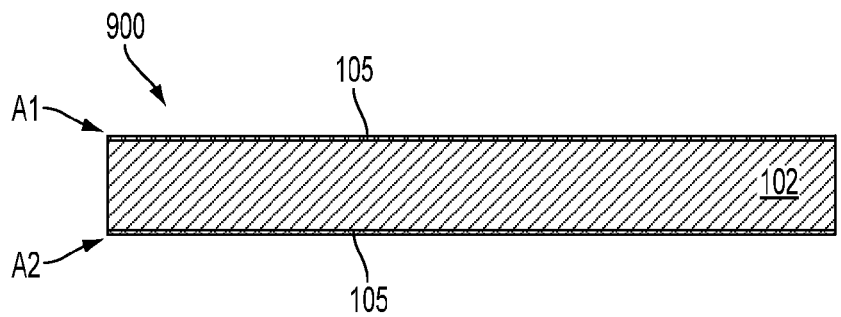
FIGS. 9A-9H schematically illustrate another package assembly subsequent to various process operations.

Referring to FIG. 9A, the package assembly 900 is depicted subsequent to a dielectric film 105 being formed on the first surface A1 and second surface A2 of the semiconductor substrate 102, as can be seen. The dielectric film 105 can be formed according to embodiments described in connection with FIG. 7B.

Figure 9B:
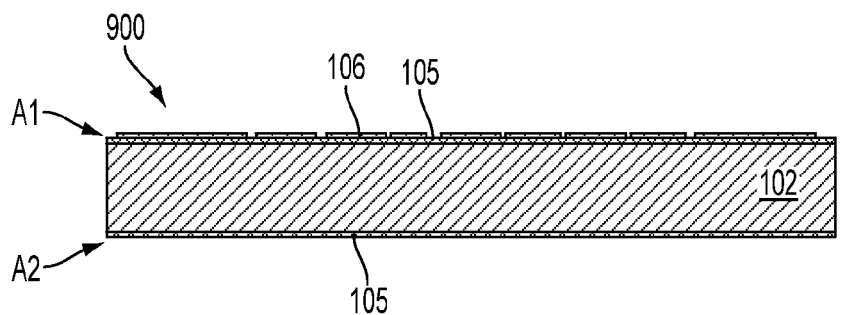

Referring to FIG. 9B, the package assembly 900 is depicted subsequent to one or more redistribution layers 106 being formed on the dielectric film 105 that is disposed on the first surface A1 of the semiconductor substrate 102. The one or more redistribution layers 106 can be formed according to embodiments described in connection with FIG. 7D.

Figure 9C:
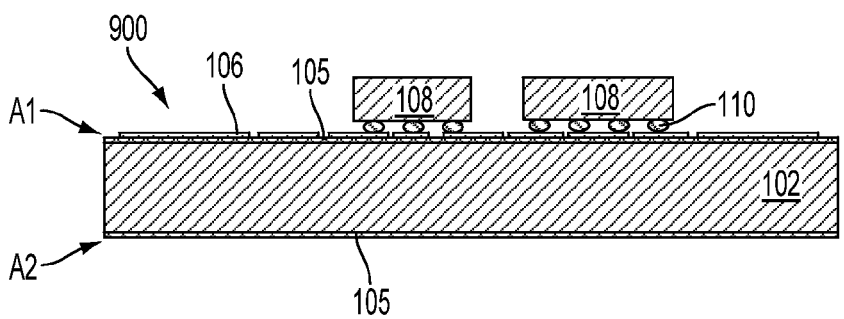

Referring to FIG. 9C, the package assembly 900 is depicted subsequent to one or more dies 108 being coupled to the one or more redistribution layers 106. The one or more dies 108 can be coupled according to embodiments described in connection with FIG. 7E.

Figure 9D:
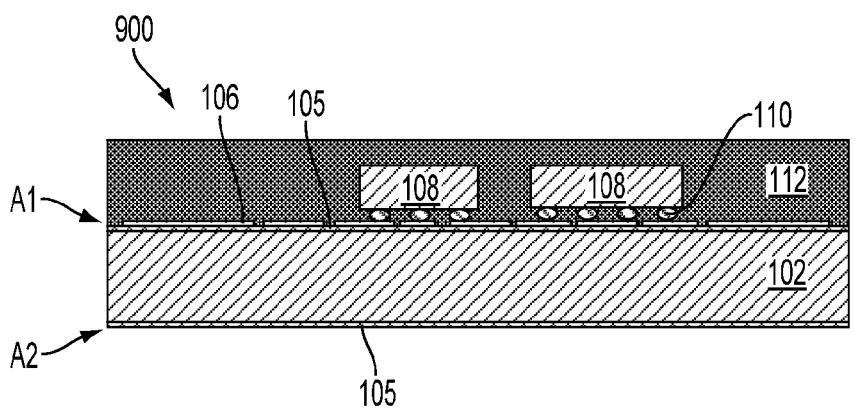

Referring to FIG. 9D, the package assembly 900 is depicted subsequent to a molding compound 112 being formed to encapsulate at least a portion of the one or more dies 108. The molding compound 112 can be formed according to embodiments described in connection with FIG. 7F.

Figure 9E:
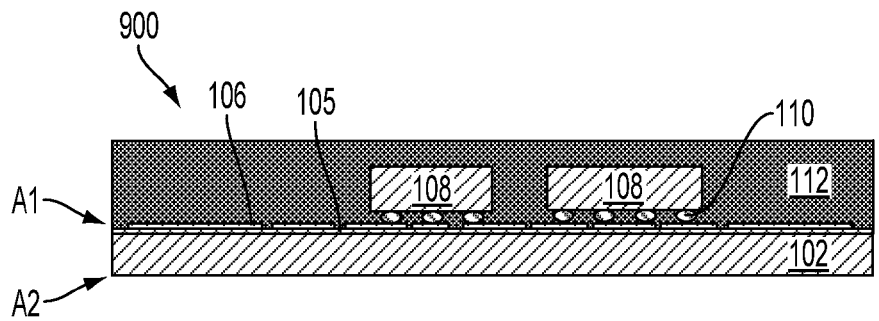

Referring to FIG. 9E, the package assembly 900 is depicted subsequent to the second surface A2 of the semiconductor substrate 102 being recessed. The second surface A2 of the semiconductor substrate 102 can be recessed by a variety of suitable techniques including, for example, a grinding process or an etch process. The semiconductor substrate 102 is recessed to facilitate the formation of one or more vias (e.g., the one or more vias 104 of FIG. 9G) through the semiconductor substrate 102. In some embodiments, the semiconductor substrate 102 is recessed to have a thickness between about 10 microns and about 500 microns. Other recessing techniques and thicknesses can be used in other embodiments. According to various embodiments, the molding compound 112 is used as a mechanical carrier to support the semiconductor substrate 102 during the recessing operation.

Figure 9F:
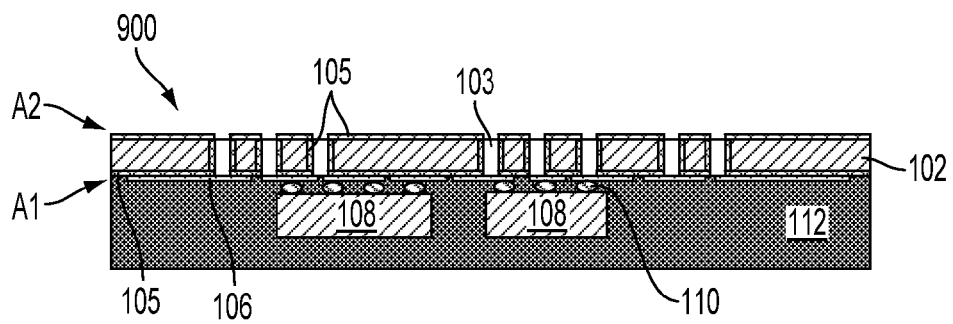

Referring to FIG. 9F, the package assembly 900 is depicted subsequent to one or more channels 103 being formed in the second surface A2 of the semiconductor substrate 102 and a dielectric film 105 being formed on the second surface A2 of the semiconductor substrate and on surfaces within the one or more channels 103, as can be seen. The one or more channels 103 are formed as part of forming one or more vias (e.g., the one or more vias 104 of FIG. 9G) through the semiconductor substrate 102. The one or more channels 103 pass through the semiconductor substrate 102 to the first surface A1 of the semiconductor substrate 102. That is, the one or more channels 103 are formed in/through the second surface A2 of the semiconductor substrate 102 to expose the one or more redistribution layers 106, as can be seen.

The one or more channels 103 can be formed by selectively removing the semiconductor material of the semiconductor substrate 102. For example, the second surface A2 of the semiconductor substrate can be patterned with a photoresist film or hard mask and etched by wet or dry etching processes to remove the semiconductor material from selected locations, as patterned. In some embodiments, a selective etch process is used and the dielectric film 105 on the first surface A1 serves as an etch stop layer. Subsequently, portions of the dielectric film 105 in the one or more channels 103 can be removed to expose the one or more redistribution layers 106. Dielectric material of the dielectric film 105 can be selectively removed using, for example, a wet or dry patterning/etching process or a laser drilling process. The electrically conductive material of the one or more redistribution layers 106 can serve as an etch/laser stop material.

The dielectric film 105 can be formed on the second surface A2 of the semiconductor substrate and on surfaces within the one or more channels 103 during a same deposition operation. The dielectric film 105 can be deposited according to embodiments described in connection with FIG. 7B.

Figure 9G:
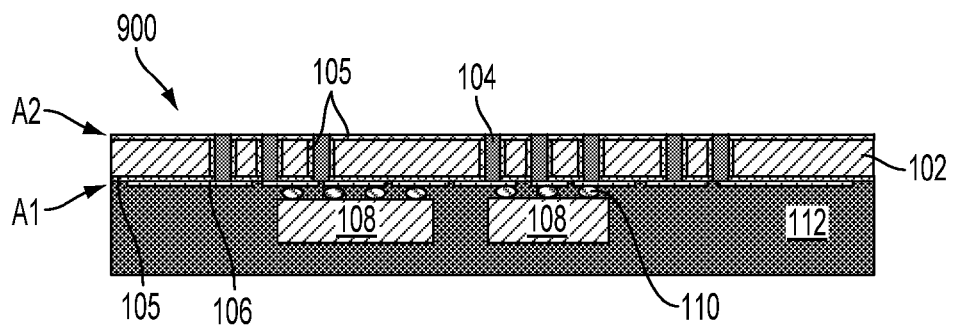

Referring to FIG. 9G, the package assembly 900 is depicted subsequent to an electrically conductive material being deposited into the one or more channels to form the one or more vias 104. The one or more vias 104 are electrically coupled to the one or more redistribution layers 106. The electrically conductive material can be deposited according to embodiments described in connection with FIG. 7C.

Figure 9H:
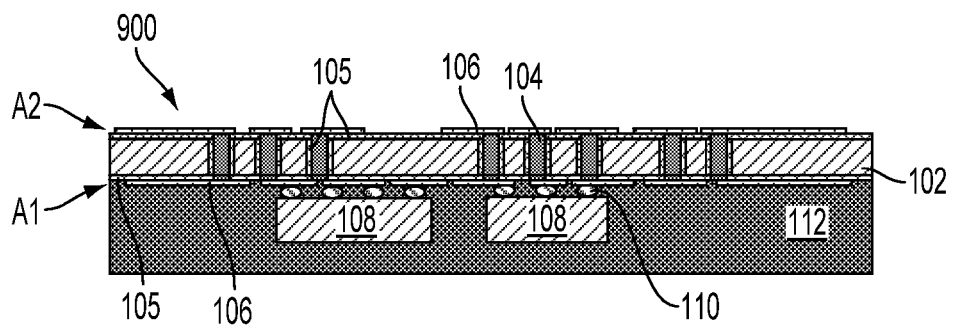

Referring to FIG. 9H, the package assembly 900 is depicted subsequent to one or more redistribution layers 106 being formed on the dielectric film 105 on the second surface A2 of the semiconductor substrate 102. The one or more redistribution layers 106 can be formed according to embodiments described in connection with FIG. 7D.

The package assembly 900 of FIG. 9H can further undergo operations described in connection with FIGS. 7I-7M and/or operations described in connection with FIGS. 8A-8G. To be clear, techniques described in connection with FIGS. 7A-7M, 8A-8G, and 9A-9H can be suitably combined, in some embodiments, and fall within the scope of the present disclosure.

Figure 10:
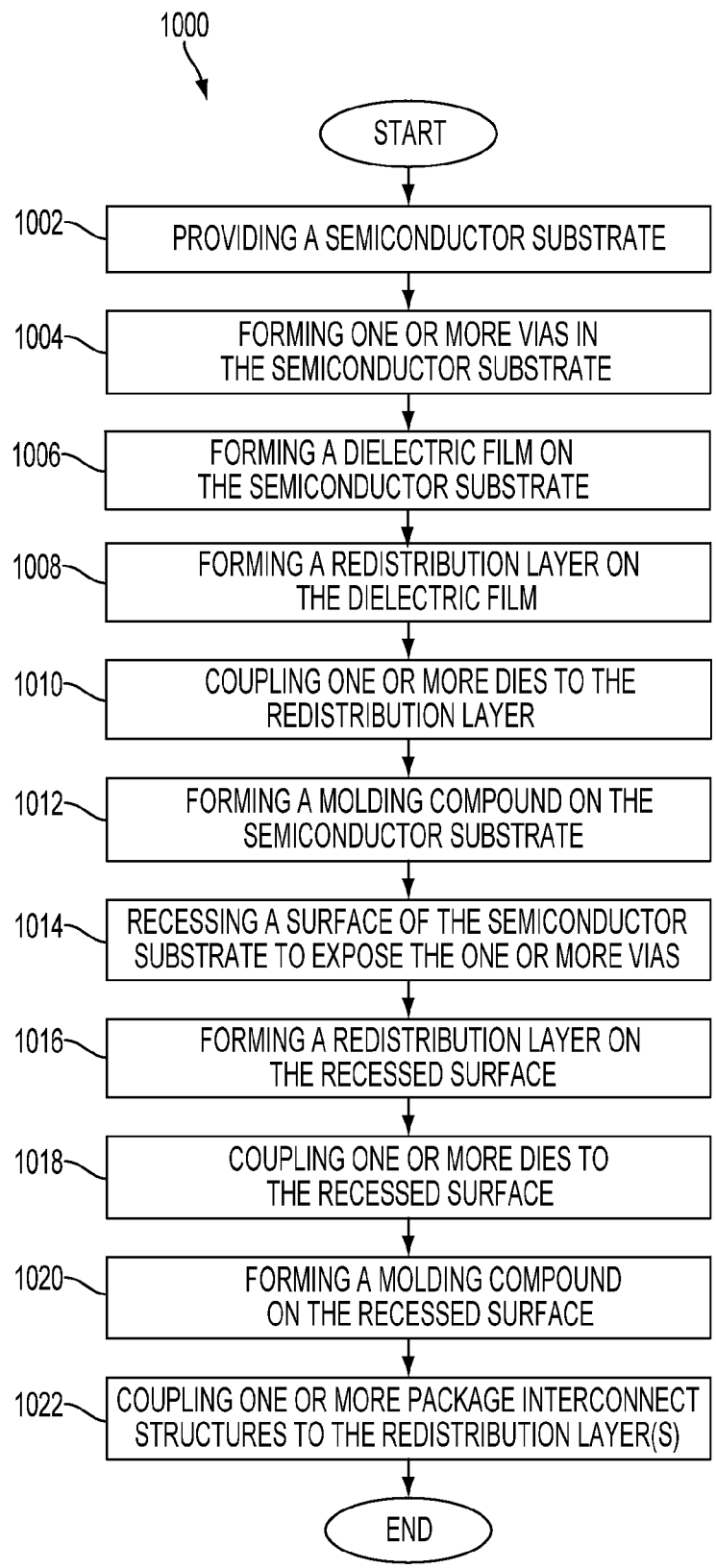
FIG. 10 is a process flow diagram of a method to fabricate a package assembly.

FIG. 10 is a process flow diagram of a method 1000 to fabricate a package assembly (e.g., the package assembly 700 of FIGS. 7A-7M). The process flow diagram depicts a method 1000 where one or more vias (e.g., the one or more vias 104 of FIG. 7C) are substantially formed prior to at least one of forming one or more redistribution layers (e.g., the one or more redistribution layers 106 of FIG. 7D), coupling one or more dies (e.g., the one or more dies 108 of FIG. 7E), forming a molding compound (e.g., the molding compound 112 of FIG. 7F), and recessing a surface (e.g., the second surface A2 of FIG. 7G), as described herein.

At 1002, the method 1000 includes providing a semiconductor substrate (e.g., the semiconductor substrate 102 of FIG. 7A). The semiconductor substrate has a first surface (e.g., the first surface A1 of FIG. 7A) that is disposed opposite to a second surface (e.g., the second surface A2 of FIG. 7A).

At 1004, the method 1000 further includes forming one or more vias (e.g., the one or more vias 104 of FIG. 7C) in the semiconductor substrate. The one or more vias are formed in the first surface of the semiconductor substrate such that they initially pass through only a portion of the semiconductor substrate without reaching the second surface. The one or more vias can be formed according to embodiments described in connection with FIGS. 7A-7C.

At 1006, the method 1000 further includes forming a dielectric film (e.g., the dielectric film 105 of FIG. 7B) on the semiconductor substrate. The dielectric film is formed on at least the first surface of the semiconductor substrate. According to various embodiments, the dielectric film is formed on the first surface of the semiconductor substrate when the dielectric film is formed on the surface of one or more channels (e.g., the one or more channels 103 of FIG. 7B) as described in connection with FIG. 7B. The dielectric film can be formed according to embodiments described in connection with FIG. 7C.

At 1008, the method 1000 further includes forming a redistribution layer (e.g., the one or more redistribution layers 106 of FIG. 7D) on the dielectric film. The redistribution layer can be formed according to embodiments described in connection with FIG. 7D.

At 1010, the method 1000 further includes coupling one or more dies (e.g., the one or more dies 108 of FIG. 7E) to the redistribution layer. The one or more dies can be coupled according to embodiments described in connection with FIG. 7E.

At 1012, the method 1000 further includes forming a molding compound (e.g., the molding compound 112 of FIG. 7F) on the semiconductor substrate. The molding compound can be formed according to embodiments described in connection with FIG. 7F.

At 1014, the method 1000 further includes recessing a surface of the semiconductor substrate to expose the one or more vias. The second surface of the semiconductor substrate is recessed to expose the one or more vias formed in the first surface. The semiconductor substrate can be recessed according to embodiments described in connection with FIG. 7G.

At 1016, the method 1000 further includes forming a redistribution layer on the recessed surface. The redistribution layer can be formed on the recessed surface according to embodiments described in connection with FIG. 7H.

At 1018, the method 1000 further includes coupling one or more dies to the recessed surface. The one or more dies can be coupled to the recessed surface according to embodiments described in connection with FIG. 7I.

At 1020, the method 1000 further includes forming a molding compound on the recessed surface. The molding compound can be formed on the recessed surface according to embodiments described in connection with FIG. 7J.

At 1022, the method 1000 further includes coupling one or more package interconnect structures to the redistribution layer(s). The or more package interconnect structures can be coupled to the redistribution layer(s) according to embodiments described in connection with FIGS. 7K-7L or FIGS. 8A-8G.

Figure 11:
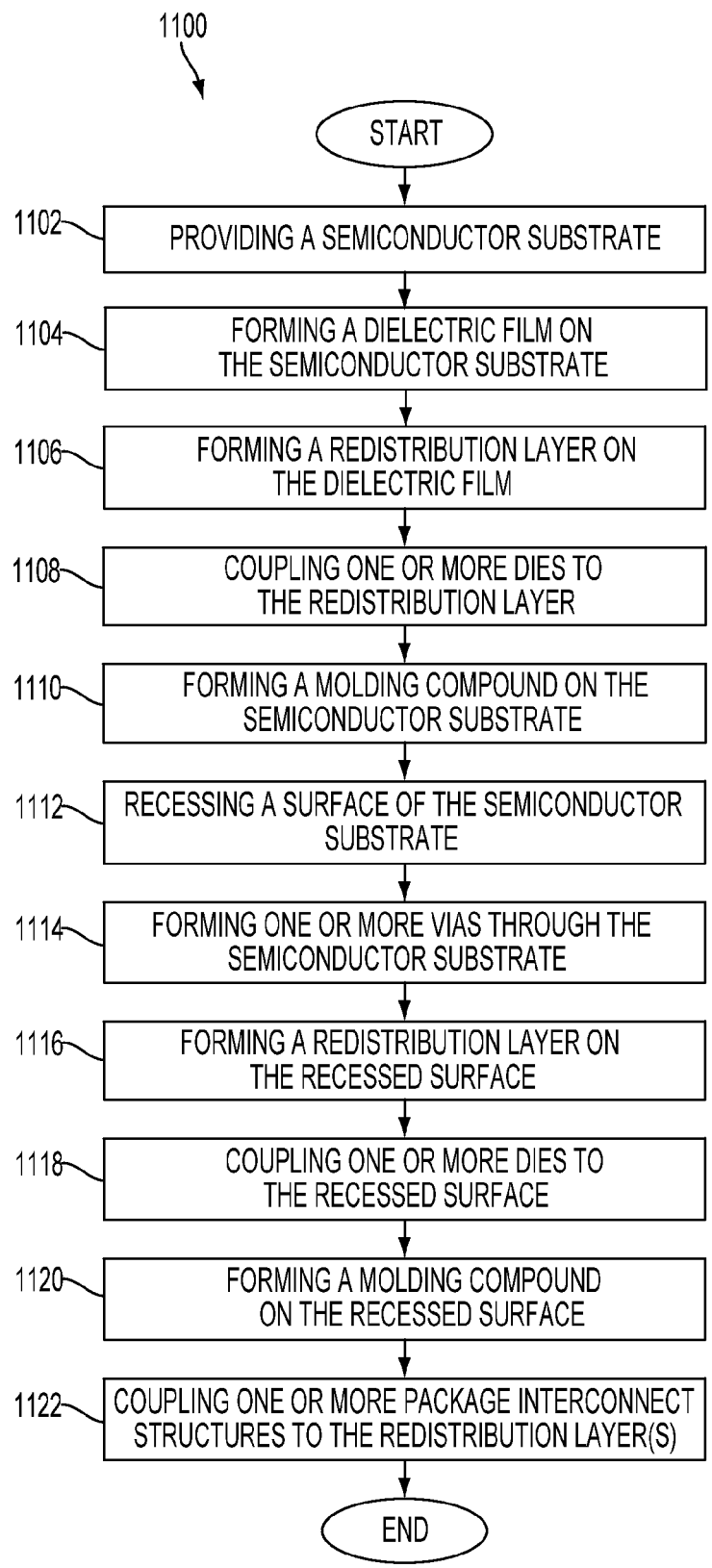
FIG. 11 is a process flow diagram of another method to fabricate a package assembly.

FIG. 11 is a process flow diagram of another method 1100 to fabricate a package assembly (e.g., the package assembly 900 of FIGS. 9A-9H). The process flow diagram depicts a method 1100 where one or more vias (e.g., the one or more vias 104 of FIG. 9G) are formed subsequent to at least one of forming one or more redistribution layers (e.g., the one or more redistribution layers 106 of FIG. 9B), coupling one or more dies (e.g., the one or more dies 108 of FIG. 9C), forming a molding compound (e.g., the molding compound 112 of FIG. 9D), and recessing a surface (e.g., the second surface A2 of FIG. 9E), as described herein.

At 1102, the method 1100 includes providing a semiconductor substrate (e.g., the semiconductor substrate 102 of FIG. 9A). The semiconductor substrate has a first surface (e.g., the first surface A1 of FIG. 9A) that is disposed opposite to a second surface (e.g., the second surface A2 of FIG. 9A).

At 1104, the method 1100 further includes forming a dielectric film (e.g., the dielectric film 105 of FIG. 9A) on the semiconductor substrate. The dielectric film is formed on at least the first surface of the semiconductor substrate. The dielectric film can be formed according to embodiments described in connection with FIG. 7C.

At 1106, the method 1100 further includes forming a redistribution layer (e.g., the one or more redistribution layers 106 of FIG. 9B) on the dielectric film. The redistribution layer can be formed according to embodiments described in connection with FIG. 9B.

At 1108, the method 1100 further includes coupling one or more dies (e.g., the one or more dies 108 of FIG. 9C) to the redistribution layer. The one or more dies can be coupled according to embodiments described in connection with FIG. 9C.

At 1110, the method 1100 further includes forming a molding compound (e.g., the molding compound 112 of FIG. 9D) on the semiconductor substrate. The molding compound can be formed according to embodiments described in connection with FIG. 9D.

At 1112, the method 1100 further includes recessing a surface of the semiconductor substrate. The second surface of the semiconductor substrate is recessed to facilitate the formation of one or more vias in the second surface. The semiconductor substrate can be recessed according to embodiments described in connection with FIG. 9E.

At 1114, the method 1100 further includes forming one or more vias (e.g., the one or more vias 104 of FIG. 9G) through the semiconductor substrate. The one or more vias are formed in the second surface of the semiconductor substrate to pass completely through the semiconductor substrate. That is, the one or more vias reach the first surface of the semiconductor substrate and are electrically coupled to the redistribution layer formed on the first surface. The one or more vias can be formed in the recessed surface according to embodiments described in connection with FIGS. 9F and 9G.

At 1116, the method 1100 further includes forming a redistribution layer on the recessed surface. The redistribution layer can be formed on the recessed surface according to embodiments described in connection with FIG. 9H.

At 1118, the method 1100 further includes coupling one or more dies to the recessed surface. The one or more dies can be coupled to the recessed surface according to embodiments described in connection with 1018 of method 1000.

At 1120, the method 1100 further includes forming a molding compound on the recessed surface. The molding compound can be formed on the recessed surface according to embodiments described in connection with 1020 of method 1000.

At 1122, the method 1100 further includes coupling one or more package interconnect structures to the redistribution layer(s). The or more package interconnect structures can be coupled to the redistribution layer(s) according to embodiments described in connection with FIGS. 7K-7L or FIGS. 8A-8G.

Although certain embodiments have been illustrated and described herein, a wide variety of alternate and/or equivalent embodiments or implementations calculated to achieve the same purposes may be substituted for the embodiments illustrated and described without departing from the scope of the present disclosure. This disclosure is intended to cover any adaptations or variations of the embodiments discussed herein. Therefore, it is manifestly intended that embodiments described herein be limited only by the claims and the equivalents thereof.

What is claimed is:

1. An apparatus comprising:
   a semiconductor substrate having (i) a first surface, and (ii) a second surface that is opposite to the first surface;
   a first redistribution layer deposited on the first surface of the semiconductor substrate;
   a second redistribution layer deposited on the second surface of the semiconductor substrate;
   a first die having (i) an active side and (ii) an inactive side that is disposed opposite to the active side of the first die, wherein the active side of the first die is coupled to the first redistribution layer deposited on the first surface of the semiconductor substrate;
   a second die having (i) an active side and (ii) an inactive side that is disposed opposite to the active side of the second die, wherein the active side of the second die is coupled to the second redistribution layer deposited on the second surface of the semiconductor substrate;
   a first package interconnect structure that is (i) deposited on the first surface of the semiconductor substrate and (ii) in contact with a first external device, wherein the first package interconnect structure is configured to couple the first redistribution layer to the first external device, and wherein the inactive side of the first die is physically attached to the first external device; and
   a second package interconnect structure deposited on the second surface of the semiconductor substrate, wherein the second package interconnect structure is configured to couple the second redistribution layer to a second external device.

2. The apparatus of claim 1, further comprising:
   a first molding compound deposited on the first surface of the semiconductor substrate, wherein the first molding compound is configured to encapsulate at least a portion of the first die.

3. The apparatus of claim 2, wherein:
   the first package interconnect structure is deposited in a first opening in the first molding compound.

4. The apparatus of claim 2, further comprising:
   a second molding compound deposited on the second surface of the semiconductor substrate, wherein the second molding compound is configured to encapsulate at least a portion of the second die.

5. The apparatus of claim 4, wherein:
   the first molding compound does not encapsulate the inactive side of the first die; and
   the second molding compound encapsulates the inactive side of the second die.

6. The apparatus of claim 4, wherein:
   the second package interconnect structure is deposited in a second opening in the second molding compound.

7. The apparatus of claim 6, wherein the second opening in the second molding compound exposes the second redistribution layer.

8. The apparatus of claim 4, wherein the second package interconnect structure is coupled to the second redistribution layer prior to a deposition of the second molding compound.

9. The apparatus of claim 4, wherein the second molding compound is deposited on the semiconductor substrate when the semiconductor substrate is in wafer form.

10. The apparatus of claim 1, wherein:
    the semiconductor substrate is part of a first package assembly; and
    the second external device is one of (i) a printed circuit board or (ii) a second package assembly.

11. The apparatus of claim 1, wherein:
    the first external device comprises a heat dissipation structure.

12. The apparatus of claim 1, wherein:
    the first external device is a heat sink.

13. The apparatus of claim 1, wherein the first die is coupled to the first redistribution layer in a flip-chip configuration using one or more bumps.

14. The apparatus of claim 1, further comprising:
    a dielectric film deposited on the first surface of the semiconductor substrate,
    wherein the first redistribution layer is deposited on the dielectric film.

15. The apparatus of claim 1, wherein the semiconductor substrate is recessed to have a thickness between about 10 microns and about 500 microns.

16. The apparatus of claim 1, wherein:
    the semiconductor substrate comprises silicon.

17. The apparatus of claim 1, further comprising:
    one or more vias formed in the semiconductor substrate, wherein the one or more vias formed in the semiconductor substrate electrically couple the first redistribution layer deposited on the first surface of the semiconductor substrate to the second redistribution layer deposited on the second surface of the semiconductor substrate.

18. The apparatus of claim 17, wherein an entirety of the second surface of the semiconductor substrate is recessed to facilitate formation of the one or more vias in the semiconductor substrate.

19. The apparatus of claim 1, wherein:
    the first die is coupled to the first redistribution layer via a first one or more bumps; and
    the second die is coupled to the second redistribution layer via a second one or more bumps.

20. The apparatus of claim 1, further comprising:
    an underfill material disposed between (i) the second die and (ii) the semiconductor substrate.

* * * * *